(12) United States Patent
Sotzing (10) Patent No.: US 7,951,902 B2
(45) Date of Patent: May 31, 2011

(54) CONJUGATED POLYMERS FROM SUBSTITUTED 3,4-PROPYLENEDIOXYTHIOPHENE, COMPOSITIONS, METHOD OF MAKING, AND USE THEREOF

(75) Inventor: Gregory A. Sotzing, Storrs, CT (US)

(73) Assignee: The University of Connecticut, Farmington, CT (US)

( * ) Notice: Subject to any disclaimer, the term of this patent is extended or adjusted under 35 U.S.C. 154(b) by 0 days.

(21) Appl. No.: 12/356,594

(22) Filed: Jan. 21, 2009

(65) Prior Publication Data

US 2009/0203873 A1    Aug. 13, 2009

Related U.S. Application Data

(60) Provisional application No. 61/022,400, filed on Jan. 21, 2008.

(51) Int. Cl.
    *C08G 75/00*    (2006.01)
(52) U.S. Cl. .................. 528/380; 528/373; 528/377
(58) Field of Classification Search ............ 528/380
    See application file for complete search history.

(56) References Cited

U.S. PATENT DOCUMENTS

| 5,111,327 | A  | 5/1992  | Blohm et al.      |
| 6,635,729 | B1 | 10/2003 | Groenendaal et al.|
| 6,791,738 | B2 | 9/2004  | Reynolds et al.   |
| 2004/0072987 | A1 | 4/2004  | Groenendaal et al.|
| 2005/0157369 | A1 | 7/2005  | Xu et al.         |
| 2005/0246888 | A1 | 11/2005 | Reynolds et al.   |
| 2006/0262377 | A1 | 11/2006 | Kojima            |

FOREIGN PATENT DOCUMENTS

| WO | 03/046106 A1 | 6/2003 |
| WO | 03/054052 A1 | 7/2003 |
| WO | 03/054053 A1 | 7/2003 |
| WO | 2004/031192 A1 | 4/2004 |
| WO | 2006117800 A2 | 11/2006 |
| WO | 2007066353 A2 | 6/2007 |

OTHER PUBLICATIONS

Walczak et al. (Polymer Preprints 2004, 45(1), 229).*
Carleton L Gaupp et al., Composite Coloration Efficiency Measurements of Electrochromic Polymers Based on 3,4-Alkylenedioxythiophenes, Chemistry of Materials (2002), 14 (9), 3964-3970.
Carleton L Gaupp et al., Poly (ProDOT-Et2): A High Contrast, High Coloration Efficiency ElectrochromicPolymer, Macromol. Rapid Commun., 23, 885-889 (2002).
Dean M. Welsh et al., Enhanced contrast ratios and rapid switching in electrochromics based on poly(3, 4-propylenedioxythiophene) derivatives, Advanced Materials (Weinheim, Germany) (1999), 11(16), 1379-1382.
Anil Kumar et al., Conducting Poly(3, 4-alkylenedioxythiophene) Derivatives as Fast Electrochromics with High-Contrast Ratios, Chemistry of Materials (1998), 10(3), 896-902.

(Continued)

*Primary Examiner* — Randy Gulakowski
*Assistant Examiner* — Shane Fang
(74) *Attorney, Agent, or Firm* — Cantor Colburn LLP (57) ABSTRACT

Polymers and copolymers having units derived from substituted 3,4-propylenedioxythiophene are disclosed. Also provided are methods of making and using the same.

20 Claims, 3 Drawing Sheets

OTHER PUBLICATIONS

Gerhard Heywang et al., Poly(alkylenedioxythiophene)s—new, very stable conducting polymers, Advanced Materials (Weinheim, Germany) (1992), 4(2), 116-18.

M Coffey et al., A facile synthesis of 3, 4-dialkoxythiophenes, Synthetic Communications (1996), 26(11), 2205-12.

Shawn Sapp et al., High Contrast Ratio and Fast-Switching Dual Polymer Electrochromic Devices, Chem. Mater., 1998, 10, 2101-2108.

Kyukwan Zong et al., 3, 4-Alkylenedioxy ring formation via double Mitsunobu reactions: an efficient route for the synthesis of 3, 4-ethylenedioxythiophene (EDOT) and 3, 4-propylenedioxythiophene (ProDOT) derivatives as monomers for electron-rich conducting polymers, Chem. Commun., 2498-2499 (2002).

Benjamin D. Reeves et al., Dual Cathodically and Anodically Coloring Electrochromic Polymer Based on a Spiro Bipropylenedioxythiophene [(Poly(spiroBiProDOT)], Adv. Mater, 14, 717-719 (2002).

Dean M. Welsh et al., Fast Electrochromic Polymers Based on New Poly (3,4-alkylenedioxythiophene) Derivatives, Synthetic Metals, vol. 102, Issues 1-3, Jun. 1999, pp. 967-968.

Javier Padilla et al., High contrast solid-state electrochromic devices from substituted 3, 4-propylenedioxythiophenes using the dual conjugated polymer approach, Synthetic Metals, vol. 157, Issues 6-7, Apr. 2007, pp. 261-268.

Luis M. Campos et al., Photovoltaic activity of a PolyProDOT derivative in a bulk heterojunction solar cell, Solar Engergy Materials & Solar Cells, 90 (2006) 3531-3546.

Emile M. Galand et al., Spray Pocessable Hybrid 3, 4-Propylenedioxythiophene: Phenylene Electrochromic Polymers, Macromolecules 2006, 39, 7286-7294.

Barry C. Thompson et al., Soluble Narrow Band Gap and Blue Propylenedioxythiophene-Cyanovinylene Polymers as Multifunctional Materials for Photovoltaic and Electrochromic Applications, J. Am. Chem. Soc., 2006, 128, 12714-12725.

International Search Report and Written Opinion, International Application No. PCT/US2009/031512; International Filing Date Jan. 21, 2009; Date of Mailing Sep. 3, 2009; 10 Pages.

Padilla et al., "Electrochemical Study of Dual Conjugated Polymer Electrochomic Devices", Journal of Electroanalytical Chemistry (2007), 609(2), 75-84.

* cited by examiner

CONJUGATED POLYMERS FROM SUBSTITUTED 3,4-PROPYLENEDIOXYTHIOPHENE, COMPOSITIONS, METHOD OF MAKING, AND USE THEREOF

CROSS REFERENCE TO RELATED APPLICATION

This application claims the benefit of U.S. Provisional Application Ser. No. 61/022,400 filed Jan. 21, 2008, which is hereby incorporated by reference in its entirety.

TECHNICAL FIELD

This invention relates to conjugated polymers prepared from unconventionally substituted 3,4-propylenedioxythiophene, compositions, method of producing such conjugated polymers, and applications utilizing the conjugated polymers.

BACKGROUND

Polymers based on alkylenedioxythiophene are materials used in electrochromics as many have the ability to change color from blue to colorless. Another advantage is that some alkylenedioxythiophene monomers can be prepared in one step from commercially available 3,4-dimethoxythiophene. 3,4-Ethylenedioxythiophene (EDOT) polymerizes oxidatively to produce polyEDOT having the ability to transition from deep blue to sky blue upon oxidation with a photopic contrast of approximately fifty percent. Higher photopic contrast and a more colorless bleached state is obtained by incorporation of an additional methylene unit into the EDOT repeat unit with 3,4-propylenedioxythiophene (ProDOT).

Known conjugated polymers do not transition from a green to a colorless state, although some are known to transition through a green color.

There remains a continuing need in the art for new materials having electrochemical properties not yet achieved in known materials.

BRIEF SUMMARY OF THE INVENTION

In one embodiment, a polymer comprises a unit derived from a substituted 3,4-propylenedioxythiophene monomer according to the structure (I):

(I)

wherein each instance of $R^1$, $R^2$, $R^3$, and $R^4$ independently is hydrogen; optionally substituted $C_1$-$C_{20}$ alkyl, $C_1$-$C_{20}$ haloalkyl, aryl, $C_1$-$C_{20}$ alkoxy, $C_1$-$C_{20}$ haloalkoxy, aryloxy, —$C_1$-$C_{10}$ alkyl-O—$C_1$-$C_{10}$ alkyl, —$C_1$-$C_{10}$ alkyl-O-aryl, —$C_1$-$C_{10}$ alkyl-aryl; or hydroxyl; with the proviso that at least one of a $R^1$ or a $R^2$ group is not hydrogen; wherein the $C_1$-$C_{20}$ alkyl, $C_1$-$C_{20}$ haloalkyl, aryl, $C_1$-$C_{20}$ alkoxy, $C_1$-$C_{20}$ haloalkoxy, aryloxy, —$C_1$-$C_{10}$ alkyl-O—$C_1$-$C_{10}$ alkyl, —$C_1$-$C_{10}$ alkyl-O-aryl, or —$C_1$-$C_{10}$ alkyl-aryl group each may be optionally substituted with one or more of $C_1$-$C_{20}$ alkyl; aryl; halogen; hydroxyl; —N—$(R^7)_2$ wherein each $R^7$ is independently hydrogen or $C_1$-$C_6$ alkyl; cyano; nitro; —COOH; —S(=O)$C_0$-$C_{10}$ alkyl; or —S(=O)$_2C_0$-$C_{10}$ alkyl.

In another embodiment, a method comprises polymerizing a composition by electrochemical or chemical reaction to form a polymer, wherein the composition comprises substituted 3,4-propylenedioxythiophene monomer according to the structure (I):

(I)

wherein each instance of $R^1$, $R^2$, $R^3$, and $R^4$ independently is hydrogen; optionally substituted $C_1$-$C_{20}$ alkyl, $C_1$-$C_{20}$ haloalkyl, aryl, $C_1$-$C_{20}$ alkoxy, $C_1$-$C_{20}$ haloalkoxy, aryloxy, —$C_1$-$C_{10}$ alkyl-O—$C_1$-$C_{10}$ alkyl, —$C_1$-$C_{10}$ alkyl-O-aryl, —$C_1$-$C_{10}$ alkyl-aryl; or hydroxyl; with the proviso that at least one of a $R^1$ or a $R^2$ group is not hydrogen; wherein the $C_1$-$C_{20}$ alkyl, $C_1$-$C_{20}$ haloalkyl, aryl, $C_1$-$C_{20}$ alkoxy, $C_1$-$C_{20}$ haloalkoxy, aryloxy, —$C_1$-$C_{10}$ alkyl-O—$C_1$-$C_{10}$ alkyl, —$C_1$-$C_{10}$ alkyl-O-aryl, or —$C_1$-$C_{10}$ alkyl-aryl group each may be optionally substituted with one or more of $C_1$-$C_{20}$ alkyl; aryl; halogen; hydroxyl; —N—$(R^7)_2$ wherein each $R^7$ is independently hydrogen or $C_1$-$C_6$ alkyl; cyano; nitro; —COOH; —S(=O)$C_0$-$C_{10}$ alkyl; or —S(=O)$_2C_0$-$C_{10}$ alkyl.

In another embodiment, a substituted 3,4-propylenedioxythiophene according to the structure (I):

(I)

wherein each instance of $R^1$, $R^2$, $R^3$, and $R^4$ independently is hydrogen; optionally substituted $C_1$-$C_{20}$ alkyl, $C_1$-$C_{20}$ haloalkyl, aryl, $C_1$-$C_{20}$ alkoxy, $C_1$-$C_{20}$ haloalkoxy, aryloxy, —$C_1$-$C_{10}$ alkyl-O—$C_1$-$C_{10}$ alkyl, —$C_1$-$C_{10}$ alkyl-O-aryl, —$C_1$-$C_{10}$ alkyl-aryl; or hydroxyl; with the proviso that at least one of a $R^1$ or a $R^2$ group is not hydrogen; wherein the $C_1$-$C_{20}$ alkyl, $C_1$-$C_{20}$ haloalkyl, aryl, $C_1$-$C_{20}$ alkoxy, $C_1$-$C_{20}$ haloalkoxy, aryloxy, —$C_1$-$C_{10}$ alkyl-O—$C_1$-$C_{10}$ alkyl, —$C_1$-$C_{10}$ alkyl-O-aryl, or —$C_1$-$C_{10}$ alkyl-aryl group each may be optionally substituted with one or more of $C_1$-$C_{20}$ alkyl; aryl; halogen; hydroxyl; —N—$(R^7)_2$ wherein each $R^7$ is independently hydrogen or $C_1$-$C_6$ alkyl; cyano; nitro; —COOH; —S(=O)$C_0$-$C_{10}$ alkyl; or —S(=O)$_2C_0$-$C_{10}$ alkyl.

Other embodiments include methods of producing the substituted 3,4-propylenedioxythiophenes, the substituted ProDOT polymers, and applications utilizing the substituted ProDOT polymers.

DETAILED DESCRIPTION OF THE INVENTION

ProDOT has three methylene units in its ring structure. Disclosed herein are substituted 3,4-propylenedioxythiophene monomers ("substituted ProDOT monomers") substituted alpha to the monomer oxygen(s), and optionally further substituted at the central methylene unit. Upon conjugation, the resulting electrochromic conjugated polymers ("substituted ProDOT polymer") exhibit different colors in the reduced state that are blue shifted from conventional polypropylenedioxythiophene ("polyProDOT"), which is a deep blue. Not wishing to be bound by theory, the blue shift is likely due to the steric interactions between the repeating units of the substituted ProDOT polymer. The substituted ProDOT polymers can have a green or red color in the reduced state depending upon the size of the substituent and the degree of interaction with the neighboring repeat units. As the steric interactions increase, the wavelength for maximum absorption ($\lambda_{max}$) of the substituted ProDOT polymer in the reduced state blue shifts to higher energy.

The color of the substituted ProDOT polymer in the oxidized state is optically transparent (colorless) similar to known unsubstituted polyProDOT in the oxidized state. The high optical transparency in the oxidized state is controlled by the conductivity of the polymer. Introduction of disorder into the structure is one method for decreasing interchain carrier mobility resulting in a decrease in the intensity of the optical transition occurring at the low energy of the near infrared region (NIR), one factor in obtaining a colorless oxidized state. By adding substitution alpha to the oxygen(s) of the 3,4-propylenedioxythiophene core will provide a disruption of conjugation of the polymer in order to increase the energy of the pi-pi* transition. The substitution will introduce steric interactions that would decrease interchain interactions of the polymer thereby increasing the optical transparency in the bleached state. Not wishing to be bound by theory, it is theorized the alpha substituents would project over the conjugated polymer backbone thereby causing steric interactions to distort thiophenes of the backbone out of planarity compared to unsubstituted 3,4-propylenedioxythiophene polymers and where the central carbon of ProDOT is substituted with an alkyl group. The distortion of planarity will be proportional to the size of the substituent groups. Tetraethyl substituents are expected to further blue shift the $\lambda_{max}$ with respect to the dimethyl substituents. As the substituent increases in size (e.g. increasing size of alkyl groups) it is anticipated that the polymer should transition to a highly transparent state in the semiconductive form. Longer alkyl substituents would further provide solubilization in organic solvents.

Other approaches besides the alpha substitution to change the color transition are discussed further herein.

The starting substituted ProDOT monomers used to prepare the substituted ProDOT polymers include those according to the general structure (I):

(I)

wherein each instance of $R^1$, $R^2$, $R^3$, and $R^4$ independently is hydrogen; optionally substituted $C_1$-$C_{20}$ alkyl, $C_1$-$C_{20}$ haloalkyl, aryl, $C_1$-$C_{20}$ alkoxy, $C_1$-$C_{20}$ haloalkoxy, aryloxy, —$C_1$-$C_{10}$ alkyl-O—$C_1$-$C_{10}$ alkyl, —$C_1$-$C_{10}$ alkyl-O-aryl, —$C_1$-$C_{10}$ alkyl-aryl; or hydroxyl; with the proviso that at least one of a $R^1$ or a $R^2$ group is not hydrogen. The $C_1$-$C_{20}$ alkyl, $C_1$-$C_{20}$ haloalkyl, aryl, $C_1$-$C_{20}$ alkoxy, $C_1$-$C_{20}$ haloalkoxy, aryloxy, —$C_1$-$C_{10}$ alkyl-O—$C_1$-$C_{10}$ alkyl, —$C_1$-$C_{10}$ alkyl-O-aryl, or —$C_1$-$C_{10}$ alkyl-aryl groups each may be optionally substituted with one or more of $C_1$-$C_{20}$ alkyl; aryl; halogen; hydroxyl; —N—$(R^7)_2$ wherein each $R^7$ is independently hydrogen or $C_1$-$C_6$ alkyl; cyano; nitro; —COOH; —S(=O)$C_0$-$C_{10}$ alkyl; or —S(=O)$_2$$C_0$-$C_{10}$ alkyl.

Specifically each instance of $R^1$ and $R^2$ independently is hydrogen; optionally substituted $C_1$-$C_{10}$ alkyl, $C_1$-$C_{10}$ haloalkyl, aryl, $C_1$-$C_{10}$ alkoxy, $C_1$-$C_{10}$ haloalkoxy, aryloxy, —$C_1$-$C_5$ alkyl-O—$C_1$-$C_5$ alkyl, —$C_1$-$C_5$ alkyl-O-aryl, —$C_1$-$C_5$ alkyl-aryl; or hydroxyl; and $R^3$ and $R^4$ are both hydrogen; with the proviso that at least one of a $R^1$ or a $R^2$ group is not hydrogen. The $C_1$-$C_{10}$ alkyl, $C_1$-$C_{10}$ haloalkyl, aryl, $C_1$-$C_{10}$ alkoxy, $C_1$-$C_{10}$ haloalkoxy, aryloxy, —$C_1$-$C_5$ alkyl-O—$C_1$-$C_5$ alkyl, —$C_1$-$C_5$ alkyl-O-aryl, or —$C_1$-$C_5$ alkyl-aryl groups each may be optionally substituted with one or more of $C_1$-$C_{20}$ alkyl; aryl; halogen; hydroxyl; —N—$(R^7)_2$ wherein each $R^7$ is independently hydrogen or $C_1$-$C_6$ alkyl; cyano; nitro; —COOH; —S(=O)$C_0$-$C_{10}$ alkyl; or —S(=O)$_2$$C_0$-$C_{10}$ alkyl.

More specifically each instance of $R^1$ and $R^2$ independently is hydrogen; optionally substituted $C_1$-$C_5$ alkyl, $C_1$-$C_5$ haloalkyl, aryl, $C_1$-$C_5$ alkoxy, $C_1$-$C_5$ haloalkoxy, aryloxy, —$C_1$-$C_3$ alkyl-O—$C_1$-$C_3$ alkyl, —$C_1$-$C_3$ alkyl-O-aryl, —$C_1$-$C_3$ alkyl-aryl; or hydroxyl; and $R^3$ and $R^4$ are both hydrogen; with the proviso that at least one of a $R^1$ or a $R^2$ group is not hydrogen. The $C_1$-$C_5$ alkyl, $C_1$-$C_5$ haloalkyl, aryl, $C_1$-$C_5$ alkoxy, $C_1$-$C_5$ haloalkoxy, aryloxy, —$C_1$-$C_3$ alkyl-O—$C_1$-$C_3$ alkyl, —$C_1$-$C_3$ alkyl-O-aryl, or —$C_1$-$C_3$ alkyl-aryl groups each may be optionally substituted with one or more of $C_1$-$C_{20}$ alkyl; aryl; halogen; hydroxyl; —N—$(R^7)_2$ wherein each $R^7$ is independently hydrogen or $C_1$-$C_6$ alkyl; cyano; nitro; —COOH; —S(=O)$C_0$-$C_{10}$ alkyl; or —S(=O)$_2$$C_0$-$C_{10}$ alkyl.

In one embodiment, at least two of the $R^1$ and $R^2$ groups are not hydrogen while the remaining two are hydrogen. Within this embodiment, both $R^1$ groups or $R^2$ groups are hydrogen while the remaining groups are other than hydrogen.

In one embodiment, each instance of $R^1$ and $R^2$ independently is hydrogen; or optionally substituted $C_1$-$C_{20}$ alkyl, $C_1$-$C_{20}$ haloalkyl, aryl, —$C_1$-$C_{10}$ alkyl-aryl; and $R^3$ and $R^4$ are both hydrogen; with the proviso that at least one of a $R^1$ or a $R^2$ group is not hydrogen. The $C_1$-$C_{20}$ alkyl, $C_1$-$C_{20}$ haloalkyl, aryl, —$C_1$-$C_{10}$ alkyl-aryl groups each may be optionally substituted with one or more of $C_1$-$C_{20}$ alkyl; aryl; halogen; hydroxyl; —N—$(R^7)_2$ wherein each $R^7$ is independently hydrogen or $C_1$-$C_6$ alkyl; cyano; nitro; —COOH; —S(=O)$C_0$-$C_{10}$ alkyl; or —S(=O)$_2C_0$-$C_{10}$ alkyl.

In another embodiment, each instance of $R^1$ and $R^2$ independently is hydrogen; or optionally substituted $C_1$-$C_{20}$ alkyl, $C_1$-$C_{20}$ haloalkyl, aryl, —$C_1$-$C_{10}$ alkyl-aryl; and $R^3$ and $R^4$ are both hydrogen; with the proviso that at least two of the $R^1$ or $R^2$ groups are not hydrogen. The $C_1$-$C_{20}$ alkyl, $C_1$-$C_{20}$ haloalkyl, aryl, —$C_1$-$C_{10}$ alkyl-aryl groups each may be optionally substituted with one or more of $C_1$-$C_{20}$ alkyl; aryl; halogen; hydroxyl; —N—$(R^7)_2$ wherein each $R^7$ is independently hydrogen or $C_1$-$C_6$ alkyl; cyano; nitro; —COOH; —S(=O)$C_0$-$C_{10}$ alkyl; or —S(=O)$_2C_0$-$C_{10}$ alkyl.

The starting substituted ProDOT monomers to prepare the substituted ProDOT polymers include those according to the general structure (II):

wherein the $R^1$ and $R^2$ are as described above.

In one embodiment, the substituted ProDOT monomer meets the general structure (II) wherein each instance of $R^1$ independently is $C_1$-$C_{10}$ alkyl or benzyl and each instance of $R^2$ independently is hydrogen, $C_1$-$C_{10}$ alkyl, or benzyl. In another embodiment, the substituted ProDOT monomer meets the general structure (II) wherein each instance of $R^1$ independently is $C_1$-$C_5$ alkyl or benzyl and each instance of $R^2$ independently is hydrogen, $C_1$-$C_5$ alkyl, or benzyl. In still yet another embodiment, the substituted ProDOT monomer meets the general structure (II) wherein each instance of $R^1$ independently is $C_1$-$C_3$ alkyl or benzyl and each instance of $R^2$ independently is hydrogen, $C_1$-$C_3$ alkyl, or benzyl.

In one embodiment, the substituted ProDOT monomers can be prepared via a trans-etherification reaction of 3,4-dialkoxythiophene with an appropriately substituted diol according to the general Scheme A below.

The starting 3,4-dialkoxythiophene can have a lower alkyl substituent for $R^5$, specifically a $C_1$-$C_4$ alkyl, and more specifically a $C_1$-$C_2$ alkyl. Commercially available 3,4-dimethoxythiophene can be used.

The substituted diol according to general Scheme A contains groups $R^1R^2$, $R^3$, and $R^4$ as defined above, or their appropriately protected functional group equivalents. Commercially available diols include 2,4-pentanediol, 2-methyl-2,4-pentanediol, 2,4-dimethyl-2,4-pentanediol, 3-methyl-2,4-heptanediol, and 7-ethyl-2-methyl-4,6-nonanediol, all of which are available from Sigma-Aldrich.

The reaction of the 3,4-dialkoxythiophene and diol is performed in the presence of a catalyst. Exemplary catalysts include sulfonic acids such as p-toluene sulfonic acid, dodecylbenzene sulfonic acid, and the like.

The solvent used in the reaction to prepare the substituted ProDOT monomer can be any high boiling, inert organic solvent including an aromatic such as toluene, xylene, and the like; and a halogenated aromatic including ortho-dichlorobenzene; mixtures thereof, and the like.

The temperature of the reaction to prepare the substituted ProDOT monomer can be at or about the boiling point of the solvent used. Specifically the reaction can be performed at temperatures of about 80 to about 300° C., more specifically about 90 to about 250° C., yet more specifically about 100 to about 200° C.

Also disclosed herein are conductive conjugated polymers that are obtained via conversion of a substituted ProDOT monomer via chemical oxidation or electrochemical oxidation. These substituted ProDOT polymers have utilities in a wide variety of applications, for example, electronic packaging, organic light-emitting diodes (LEDs), electrochromic windows and displays, optically transparent electrodes, volatile organic gas sensors, as well as other applications discussed herein.

The substituted ProDOT monomers disclosed herein can be polymerized alone to form a conjugated homopolymer. Also provided herein are copolymers comprising units derived from two or more different substituted ProDOT monomers. Also provided herein are copolymers comprising units derived from a substituted ProDOT and an additional monomer ("co-monomer") which provide a tailoring of the conductivity or optoelectronic properties of the resulting polymer. The co-monomer can include electroactive monomers or non-electroactive monomers. "Electroactive monomer" as used herein means a monomer or oligomer that is capable of copolymerization with substituted ProDOT, and that imparts or enhances the electrical/electronic properties of the resulting copolymer, including such properties as electrical conductivity, semiconductivity, electroluminescence, electrochromicity, photovoltaic properties, or the like. "Non-electroactive monomer" means a monomer that is capable of copolymerization and that either decreases or does not adversely affect the electrical/electronic properties of the resulting copolymer.

Examples of suitable electroactive monomers include those known in the art to exhibit electroactivity, including but not limited to thiophene, substituted thiophene, thieno[3,4-b]thiophene, substituted thieno[3,4-b]thiophene, dithieno[3,4-b:3',4'-d]thiophene, thieno[3,4-b]furan, substituted thieno[3,4-b]furan, bithiophene, substituted bithiophene, pyrrole, substituted pyrrole, phenylene, substituted phenylene, naphthalene, substituted naphthalene, biphenyl and terphenyl and their substituted versions, phenylene vinylene, substituted phenylene vinylene, and the like.

Suitable co-monomers include unsubstituted and 2- or 6-substituted thieno[3,4-b]thiophene and thieno[3,4-b]furan having the general structures (III), (IV), and (V):

(III)

(IV)

(V)

wherein $Q^1$ is S or O; and $R^6$ is hydrogen, $C_1$-$C_{12}$ alkyl, $C_1$-$C_{12}$ haloalkyl including perfluoroalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl. Specifically, $Q^1$ is S or O; and $R^6$ is hydrogen.

3,4-Ethylenedioxythiophene, 3,4-ethylenedithiathiophene, 3,4-ethylenedioxypyrrole, 3,4-ethylenedithiapyrrole, 3,4-ethylenedioxyfuran, 3,4-ethylenedithiafuran, and derivatives having the general structure (VI):

(VI)

wherein each occurrence of $Q^1$ is independently S or O; $Q^2$ is S, O, or N—$R^7$ wherein $R^7$ is hydrogen or $C_1$-$C_6$ alkyl; and each occurrence of $R^6$ is hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl.

Isathianaphthene, pyridothiophene, pyrizinothiophene, and derivatives having the general structure (VII):

(VII)

wherein $Q^2$ is S, O, or N—$R^7$ wherein $R^7$ is hydrogen or $C_1$-$C_6$ alkyl; each occurrence of $Q^3$ is independently CH or N; and each occurrence of $R^6$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl.

Oxazole, thiazole, and derivatives having the general structure (VIII):

(VIII)

wherein $Q^1$ is S or O.

Pyrrole, furan, thiophene, and derivatives having the general structure (IX):

(IX)

wherein $Q^2$ is S, O, or N—$R^7$ wherein $R^7$ is hydrogen or $C_1$-$C_6$ alkyl; and each occurrence of $R^6$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl.

Bithiophene, bifuran, bipyrrole, and derivatives having the following general structure (X):

(X)

wherein each occurrence of $Q^2$ is independently S, O, or N—$R^7$ wherein $R^7$ is hydrogen or $C_1$-$C_6$ alkyl; and each occurrence of $R^6$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl.

Terthiophene, terfuran, terpyrrole, and derivatives having the following general structure (XI):

(XI)

wherein each occurrence of $Q^2$ is independently S, O, or N—$R^7$ wherein $R^7$ is hydrogen or $C_1$-$C_6$ alkyl; and each occurrence of $R^6$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl.

Thienothiophene, thienofuran, thienopyrrole, furanylpyrrole, furanylfuran, pyrolylpyrrole, and derivatives having the following general structure (XII)

wherein each occurrence of $Q^2$ is independently S, O, or N—$R^7$ wherein $R^7$ is hydrogen or $C_1$-$C_6$ alkyl; and each occurrence of $R^6$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl.

Dithienothiophene, difuranylthiophene, dipyrrolylthiophene, dithienofuran, dipyrrolylfuran, dipyrrolylpyrrole, and derivatives having the following general structure (XIII):

(XIII)

wherein each occurrence of $Q^2$ is independently S, O, or N—$R^7$ wherein $R^7$ is hydrogen or $C_1$-$C_6$ alkyl; $Q^4$ is $C(R^6)_2$, S, O, or N—$R^7$; and each occurrence of $R^6$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl.

Dithienylcyclopentenone, difuranylcyclopentenone, dipyrrolylcyclopentenone and derivatives having the following general structure (XIV):

(XIV)

wherein each occurrence of $Q^2$ is independently S, O, or N—$R^7$ wherein $R^7$ is hydrogen or $C_1$-$C_6$ alkyl; and E is O or $C(R^8)_2$, wherein each occurrence of $R^8$ is an electron withdrawing group.

Other suitable heteroaryl monomers include those having the following general structure (XV):

(XV)

wherein each occurrence of $Q^1$ is independently S or O; each occurrence of $Q^2$ is independently S, O, or N—$R^7$ wherein $R^7$ is hydrogen or $C_1$-$C_6$ alkyl; each occurrence of $R^6$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl. In one embodiment, each occurrence of $Q^1$ is O; each occurrence of $Q^2$ is S; and each occurrence of $R^6$ is hydrogen.

Dithienovinylene, difuranylvinylene, and dipyrrolylvinylene according to the structure (XVI):

(XVI)

wherein each occurrence of $Q^2$ is independently S, O, or N—$R^7$ wherein $R^7$ is hydrogen or $C_1$-$C_6$ alkyl; each occurrence of $R^6$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl; and each occurrence of $R^9$ is hydrogen, $C_1$-$C_6$ alkyl, or cyano.

1,2-Trans(3,4-ethylenedioxythienyl)vinylene, 1,2-trans(3,4-ethylenedioxyfuranyl)vinylene, 1,2-trans(3,4-ethylenedioxypyrrolyl)vinylene, and derivatives according to the structure (XVII):

(XVII)

wherein each occurrence of $Q^3$ is independently $CH_2$, S, or O; each occurrence of $Q^2$ is independently S, O, or N—$R^7$ wherein $R^7$ is hydrogen or $C_1$-$C_6$ alkyl; each occurrence of $R^6$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl; and each occurrence of $R^9$ is hydrogen, $C_1$-$C_6$ alkyl, or cyano.

The class bis-thienylarylenes, bis-furanylarylenes, bis-pyrrolylarylenes and derivatives according to the structure (XVIII):

(XVIII)

wherein each occurrence of $Q^2$ is independently S, O, or N—$R^7$ wherein $R^7$ is hydrogen or $C_1$-$C_6$ alkyl; each occurrence of $R^6$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl; and represents an aryl. Exemplary aryl groups include furan, pyrrole, N-substituted pyrrole, phenyl, biphenyl, thiophene, fluorene, 9-alkyl-9H-carbazole, and the like.

The class of bis(3,4-ethylenedioxythienyl)arylenes, related compounds, and derivatives according to the structure (XIX):

(XIX)

wherein each occurrence of $Q^1$ is independently S or O; each occurrence of $Q^2$ is independently S, O, or N—$R^7$ wherein $R^7$ is hydrogen or $C_1$-$C_6$ alkyl; each occurrence of $R^6$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl; and represents an aryl.

An exemplary bis(3,4-ethylenedioxythienyl)arylenes according to structure (XIX) includes the compound wherein all $Q^1$ are O, both $Q^2$ are S, all $R^6$ are hydrogen, and is phenyl linked at the 1 and 4 positions. Another exemplary compound is where all $Q^1$ are O, both $Q^2$ are S, all $R^6$ are hydrogen, and is thiophene linked at the 2 and 5 positions.

The class of compounds according to structure (XX):

(XX)

wherein each occurrence of $Q^1$ is independently S or O; each occurrence of $Q^2$ is independently S, O, or N—$R^7$ wherein $R^7$ is hydrogen or $C_1$-$C_6$ alkyl; $Q^4$ is $C(R^6)_2$, S, O, or N—$R^7$; and each occurrence of $R^6$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl. In one embodiment, each occurrence of $Q^1$ is O; each occurrence of $Q^2$ is S; each occurrence of $R^6$ is hydrogen; and $R^7$ is methyl.

The class of compounds according to structure (XXI):

(XXI)

wherein each occurrence of $Q^2$ is independently S, O, or N—$R^7$ wherein $R^7$ is hydrogen or $C_1$-$C_6$ alkyl; $Q^4$ is $C(R^6)_2$, S, O, or N—$R^7$; and each occurrence of $R^6$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl.

The class of compounds according to structure (XXII):

(XXII)

wherein each occurrence of $Q^2$ is independently S, O, or N—$R^7$ wherein $R^7$ is hydrogen or $C_1$-$C_6$ alkyl; each occurrence of $Q^4$ is $C(R^6)_2$, S, O, or N—$R^7$; and each occurrence of $R^6$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl.

The class of compounds according to structure (XXIII):

(XXIII)

wherein $Q^2$ is S, O, or N—$R^7$ wherein $R^7$ is hydrogen or $C_1$-$C_6$ alkyl; and each occurrence of $Q^1$ is independently S or O.

The class of compounds according to structure (XXIV):

(XXIV)

wherein each occurrence of $Q^2$ is independently S, O, or N—$R^7$ wherein $R^7$ is hydrogen or $C_1$-$C_6$ alkyl; and each occurrence of $Q^1$ is independently S or O.

The class of compounds according to structure (XXV):

(XXV)

wherein $Q^2$ is S, O, or N—$R^7$ wherein $R^7$ is hydrogen or $C_1$-$C_6$ alkyl; each occurrence of $Q^1$ is independently S or O; and each occurrence of $R^6$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, —$C_1$-$C_6$ alkyl-aryl, —$C_1$-$C_6$ alkyl-O-aryl, or —$C_1$-$C_6$ alkyl-O-aryl. In one embodiment, one $R^6$ is methyl and the other $R^6$ is benzyl, —$C_1$-$C_6$ alkyl-O-phenyl, —$C_1$-$C_6$ alkyl-O-biphenyl, or —$C_1$-$C_6$ alkyl-biphenyl.

The class of compounds according to structure (XXVI):

(XXVI)

wherein each occurrence of $Q^2$ is independently S, O, or N—$R^7$ wherein $R^7$ is hydrogen or $C_1$-$C_6$ alkyl; each occurrence of $Q^1$ is independently S or O; and each occurrence of $R^6$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl. In one embodiment, one $R^6$ is methyl and the other $R^6$ is —$C_1$-$C_6$ alkyl-O-phenyl or —$C_1$-$C_6$ alkyl-O-biphenyl per geminal carbon center.

The class of compounds according to structure (XXVII):

(XXVII)

wherein each occurrence of $Q^2$ is independently S, O, or N—$R^7$ wherein $R^7$ is hydrogen or $C_1$-$C_6$ alkyl; each occurrence of $Q^1$ is independently S or O; each occurrence of $R^6$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl; and represents an aryl. In one embodiment, one $R^6$ is methyl and the other $R^6$ is —$C_1$-$C_6$ alkyl-O-phenyl or —$C_1$-$C_6$ alkyl-O-biphenyl per geminal carbon center.

The class of compounds according to structure (XXVIII):

(XXVIII)

wherein each occurrence of $Q^2$ is independently S, O, or N—$R^7$ wherein $R^7$ is hydrogen or $C_1$-$C_6$ alkyl; each occurrence of $Q^1$ is independently S or O; and each occurrence of $R^6$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl.

The class of compounds according to structure (XXIX):

(XXIX)

wherein each occurrence of $Q^2$ is independently S, O, or N—$R^7$ wherein $R^7$ is hydrogen or $C_1$-$C_6$ alkyl; each occurrence of $Q^1$ is independently S or O; and each occurrence of $R^6$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl.

In one embodiment, the copolymer comprises 1 to about 99 percent substituted ProDOT monomer units, specifically about 20 to about 90 percent, more specifically about 30 to about 80 percent, and yet more specifically about 40 to about 70 percent substituted ProDOT monomer units present in the copolymer based on the total units of the copolymer.

As used herein, "alkyl" includes straight chain, branched, and cyclic saturated aliphatic hydrocarbon groups, having the specified number of carbon atoms, generally from 1 to about 20 carbon atoms for the straight chain and generally from 3 to about 20 carbon atoms for the branched and cyclic. Examples of alkyl include, but are not limited to, methyl, ethyl, n-propyl, isopropyl, n-butyl, 3-methylbutyl, t-butyl, n-pentyl, sec-pentyl, cyclopentyl, cyclohexyl, and octyl. Specific alkyl groups include lower alkyl groups, those alkyl groups having from 1 to about 8 carbon atoms, from 1 to about 6 carbon atoms, or from 1 to about 4 carbons atoms.

As used herein "haloalkyl" indicates straight chain, branched, and cyclic alkyl groups having the specified number of carbon atoms, substituted with 1 or more halogen atoms, generally up to the maximum allowable number of halogen atoms ("perhalogenated", e.g. perfluorinated). Examples of haloalkyl include, but are not limited to, trifluoromethyl, difluoromethyl, 2-fluoroethyl, and penta-fluoroethyl.

As used herein, "alkoxy" includes an alkyl group as defined above with the indicated number of carbon atoms attached through an oxygen bridge (—O—). Examples of alkoxy include, but are not limited to, methoxy, ethoxy, n-propoxy, i-propoxy, n-butoxy, 2-butoxy, t-butoxy, n-pentoxy, 2-pentoxy, 3-pentoxy, isopentoxy, neopentoxy, n-hexoxy, 2-hexoxy, 3-hexoxy, and 3-methylpentoxy.

"Haloalkoxy" indicates a haloalkyl group as defined above attached through an oxygen bridge.

As used herein, the term "aryl" indicates aromatic groups containing only carbon in the aromatic ring or rings. Such aromatic groups may be further substituted with carbon or non-carbon atoms or groups. Typical aryl groups contain 1 or 2 separate, fused, or pendant rings and from 6 to about 12 ring atoms, without heteroatoms as ring members. Where indicated aryl groups may be substituted. Such substitution may include fusion to a 5 to 7-membered saturated cyclic group that optionally contains 1 or 2 heteroatoms independently chosen from N, O, and S, to form, for example, a 3,4-methylenedioxy-phenyl group. Aryl groups include, for example, phenyl, naphthyl, including 1-naphthyl and 2-naphthyl, anthracene, pentacene, fluorene, and bi-phenyl.

"Halo" or "halogen" as used herein refers to fluoro, chloro, bromo, or iodo.

Compounds are described using standard nomenclature. For example, any position not substituted by any indicated group is understood to have its valency filled by a bond as indicated, or a hydrogen atom. A dash ("-") that is not between two letters or symbols is used to indicate a point of attachment for a substituent. For example, —CHO is attached through carbon of the carbonyl group.

Also contemplated herein are blends comprising two or more substituted ProDOT polymers. Additionally, blends comprising at least one of the foregoing substituted ProDOT polymers and an additional polymer are also contemplated. The additional polymer may be a conductive polymer, a non-conductive polymer, a thermoplastic or combinations comprising at least one of the foregoing.

In one method, a substituted ProDOT monomer and an optional co-monomer is chemically oxidized in a liquid to form the substituted ProDOT polymer. Suitable oxidants include the iron (III) salts of organic acids, inorganic acids containing organic residues, and inorganic acids, such as $FeCl_3$, $Fe(ClO_4)_3$. Oxidants such as $H_2O_2$, $K_2Cr_2O_7$, alkali or ammonium persulfates, alkali perborates, potassium permanganate, $NOBF_4$, or copper salts such as copper tetrafluoroborate may also be used. In addition, bromine, iodine, and oxygen may advantageously be used as oxidants. Persulfates and the iron (III) salts of organic acids and inorganic acids containing organic residues can be used because they are not corrosive. Examples of suitable iron (III) salts of organic acids are the Fe(III) salts of $C_1$-$C_{30}$ alkyl sulfonic acids, such as methane or dodecane sulfonic acid; aliphatic $C_1$-$C_{20}$ carboxylic acids, such as 2-ethylhexylcarboxylic acid; aliphatic $C_1$-$C_{20}$ perfluorocarboxylic acids, such as trifluoroacetic acid and perfluorooctanoic acid; aliphatic dicarboxylic acids, such as oxalic acid; and aromatic, optionally $C_1$-$C_{20}$ alkyl-substituted sulfonic acids, such as benzenesulfonic acid, p-toluenesulfonic acid and dodecyl benzenesulfonic acid. Mixtures of the aforementioned Fe(III) salts of organic acids may also be used. Examples of iron (III) salts of inorganic acids containing organic residues are the iron (III) salts of sulfuric acid semiesters of $C_1$-$C_{20}$ alkanols, for example the Fe(III) salt of lauryl sulfate.

Suitable liquids for conducting the oxidative chemical reaction are those that do not adversely affect the reaction, and specifically are inert. Suitable liquids can further be selected on the basis of economics, environmental factors, and the like, and may be organic, aqueous, or a mixture thereof. Suitable organic liquids may be aliphatic alcohols such as methanol and ethanol; aliphatic ketones such as acetone and methyl ethyl ketone; aliphatic carboxylic esters such as ethyl acetate; aromatic hydrocarbons such as toluene and xylene; aliphatic hydrocarbons such as hexane; aliphatic nitriles such as acetonitrile; chlorinated hydrocarbons such as dichloromethane; aliphatic sulfoxides such as dimethyl sulfoxide; and the like, as well as mixtures comprising at least one of the foregoing organic liquids. Specifically aqueous liquids are used, that is, a liquid comprising water or water-miscible organic liquids such as lower alcohols, acetonitrile, tetrahydrofuran, dimethylacetamide, dimethylformamide, and the like.

Heat may not be necessary for the formation of the substituted ProDOT polymer in the chemical oxidation process. However, it can be used to speed up the conversion to the conjugated polymers. Heat can be administered to the reaction medium either during its exposure to chemical oxidants or after the exposure. Typical reaction conditions include temperatures of about 0 to about 100° C. The oxidation is continued for a period of time until the desired conjugated polymer is prepared. The polymerization time may be a few minutes up to about 48 hours, and depends on a number of factors including the size of the reactor utilized, the reaction temperature, the oxidant utilized, and the like.

In one embodiment, a substituted ProDOT monomer and an optional co-monomer is converted to a conjugated polymer by a chemical oxidant such as $FeCl_3$ or those previously discussed. When a chemical oxidant is used, the addition of a salt to the reaction solution can be used to get adequate oxidation. Suitable salts for this purpose include organic soluble salts, inorganic salts, ionic liquids, and polyelectrolytes such as polystyrene sulfonate, polyacrylic acid sodium salt, poly(meth)acrylic acid sodium salt, etc. Exemplary salts include tetra-alkyl ammonium, ammonium, lithium, or sodium cations with tetrafluoroborate, hexafluorophosphate, perchlorate, halides, toluenesulfonate and other aliphatic sulfonate salts, trifluoromethylsulfonate, bistrifluoromethanesulfonimide, sulfates, carbonates or persulfates.

An alternative method for preparing the substituted ProDOT polymer is by electrochemical oxidation to convert a substituted ProDOT monomer and an optional co-monomer to a conjugated polymer. Conventional electrolytic cells can be used for the reaction. In one embodiment, a three-electrode configuration (working electrode, counter electrode, and reference electrode) in operable communication with an electrolyte is used, comprising a working electrode, specifically a button working electrode selected from the group consisting of platinum, gold, vitreous carbon, and indium doped tin oxide working electrodes or non-button electrodes such as the ITO, and platinum flag, a platinum flag counter electrode, and an Ag/Ag+ non-aqueous reference electrode.

Suitable electrolytes include tetraalkylammonium salts, e.g., tetraethylammonium, tetrapropyl ammonium, tetrabutylammonium salts, as well as salts of cations such as lithium trifluoromethansulfonate. Suitable counter ions include but are not limited inorganic ions such as bistrifluoromethylsulfonimide, tosylate, perchlorate, tetrafluoroborate, hexafluorophosphate, and halides such as chloride, bromide, iodide, and organic anions such as tosylate, triflate, trifluoromethylsulfonimide, or polyanions, e.g., polystyrenesulfonate, the anionic form of acrylic acid. Solvents may be used to prepare an electrolyte solution, for example water, ethanol, methanol, acetonitrile, propylene carbonate, tetraglyme, methylene chloride, chloroform, and tetrahydrofuran. Specified solvents are water, acetonitrile, and propylene carbonate.

Other suitable electrolytes include ionic liquids such as butylmethylimidazolium hexafluorophosphate (BMIM $PF_6$) and butylmethylimidizolium tetrafluoroborate (BMIM $BF_4$).

Specified electrolytes include tetrabutylammonium perchlorate/acetonitrile, tetrabutylammonium tetrafluoroborate, tetrabutylammonium hexafluorophosphate/acetonitrile, lithium trifluoromethansulfonate/acetonitrile, and lithium triflate/acetonitrile. Exemplary concentrations of the electrolytes are about 0.05 to about 0.15, specifically about 0.1 M.

A specified working electrode is a vitreous carbon electrode and the electrolyte is tetrabutylammonium hexafluorophosphate/acetonitrile. Another specified working electrode is a platinum button electrode and the electrolyte is tetrabutylammonium hexafluorophosphate/acetonitrile.

The substituted ProDOT polymers disclosed herein provide for a transition from green to colorless, a result not achieved with previously known conjugated polymers.

The electrical conductivity of the films prepared from the polymers can be readily modified, if necessary, to meet the requirements of a desired application by doping with conventional acidic dopants (p-dopants) or basic dopants (n-dopants) known in the art. Suitable p-dopants include mineral acids such as HCl, $HNO_3$, $H_2SO_4$, $H_3PO_4$, HBr, and HI; organic sulfonic acids such as dodecyl benzene sulfonic acid, lauryl sulfonic acid, camphor sulfonic acid, organic acid dyes, methane sulfonic acid, and toluene sulfonic acid; polymeric sulfonic acids such as poly(styrene sulfonic acid) and copolymers of styrene sulfonic acids; carboxylic acids such as adipic acid, azelaic acid, and oxalic acid; and polycarboxylic acids such as poly(acrylic acid), poly(maleic acid), poly (methacrylic acid), and copolymers formed from acrylic acid, maleic acid, or methacrylic acid. Conventional mixed dopants comprising one or more of the foregoing, such as a mixture of a mineral acid and an organic acid, can also be used to impart the desired electroactive character to the films. Suitable basic dopants include, but are not limited to Na, K, Li, and Ca. Other suitable dopants include $I_2$, $PF_6$, $SbF_6$, and $FeCl_3$. In some instances the oxidant and the dopant may be the same.

Admixtures of the polymer with other electroactive materials such as laser dyes, other electroactive polymers, hole transport or electron transport materials, including electroactive organometallic compounds, are also contemplated herein. Such materials can be added to the polymer before or after formation of the solution or dispersion. Additives such as ethylene glycol, diethylene glycol, mannitol, propylene 1,3-glycol, butane 1,4-glycol, N-methylpyrrolidone, sorbitol, glycerol, propylene carbonate, and other appropriate high boiling organics may be added to dispersions of the polymeric compositions to improve conductivity.

Additional additives may also be used, and include conductive fillers such as particulate copper, silver, nickel, aluminum, carbon black (carbon nanotubes, buckminister fullerene), and the like; non-conductive fillers such as talc, mica, wollastonite, silica, clay, dyes, pigments (zeolites), and the like, to promote specific properties such as increased modulus, surface hardness, surface color and the like; antioxidants; UV stabilizers; viscosity modifiers; and surfactants such as acetylenic diols, surfactants typically being added to control stability, surface tension, and surface wettability.

The substituted ProDOT polymers disclosed herein can be processed by conventional methods to provide uniform, thin films that possess utility in numerous applications. Films and materials comprising the above-described conjugated polymers can be utilized in a variety of applications, including antistatic coatings, electrically conductive coatings, electrochromics, photovoltaic devices, light emitting diodes for display applications, hole injection layers for light emitting diodes, near infrared light emitting diodes, transparent conductive coating for indium doped tin oxide replacement, flat panel displays, flexible displays, photoimageable circuits, printable circuits, thin film transistor devices, batteries, electrical switches, capacitor coatings, corrosion resistant coatings, electromagnetic shielding, sensors, biosensors, dimmable mirrors, type III supercapacitors, LED lighting, and the like, and specifically electrochromic windows, electrochromic films for reflective devices, and electrochromic displays. The electrical conductivity of the polymers can be readily modified, if necessary, to meet the requirements of any of the previously mentioned applications by doping the polymers with conventional dopants such as anions (for p-doped polymers) and cation dopants (for n-doped polymers) known in the art.

The following illustrative examples are provided to further describe how to make and use the polymers and are not intended to limit the scope of the claimed invention.

EXAMPLES

Example 1

Preparation of a Dimethyl Substituted 3,4-Propylenedioxythiophene (aDM-ProDOT)

A three-neck round bottom flask is vacuum dried, fitted with a stir bar, thermometer, and drying tube and maintained under nitrogen. About 500 milliliters (ml) of anhydrous xylene is cannulated into the flask. Two ml of 3,4-dimethoxy thiophene 1 (DMOT) (0.0166 mol), 4.85 ml of 2,4-pentanediol 2 (0.0332 mol), and 0.61 ml of catalyst dodecylbenzene sulfonic acid (DBSA) (0.0025 mol) are added to the flask sequentially with previously degassed disposable syringes through the rubber septa fitted on one of the necks of the flask. The molar proportion between DMOT:diol:DBSA is 1.00:2.00:0.15. The reaction is set to run for five days under stirring at a temperature of around 100° C. The reaction is monitored on a daily basis by gas chromatography-mass spectrometry (GC-MS). After five days, the reaction is cooled to ambient temperature and filtered to remove any solid particulates. The xylene is stripped using a rotary evaporator to result in a green oil. The oil is taken up in a small amount of chloroform and extracted with water three times using sodium chloride to break any emulsion. The chloroform is stripped leaving a green oil. The crude mixture is purified by column chromatography using 70:30 toluene:n-hexane as the eluting solvent. The first fractions contain the product 2,4-dimethyl-3,4-dihydro-2H-thieno[3,4-b][1,4]dioxepine 3 (aDM-ProDOT) and subsequent fractions contain DMOT 1 starting material. The aDM-ProDOT 3 is isolated as a white solid that is dried under vacuum. The final product was confirmed by GC-MS and $^1$H-NMR.

Figure 1:
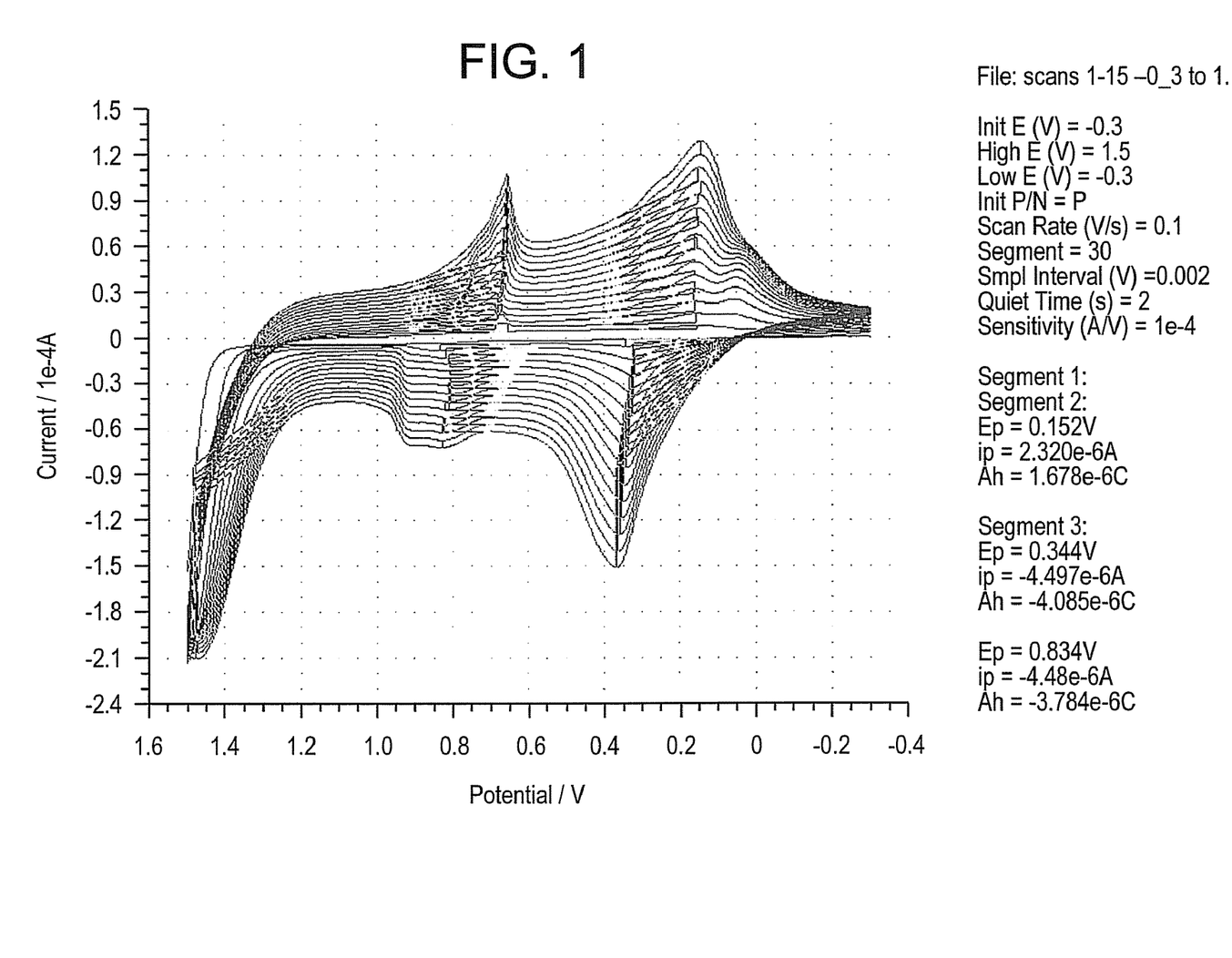
FIG. 1 illustrates the results of cyclic voltammetry of a 10 mM aDM-ProDOT/100 mM TBAPF$_6$ solution.

FIG. 1 illustrates the results of cyclic voltammetry of a 10 mM aDM-ProDOT/100 mM tetrabutylammonium hexafluorophosphate (TBAPF$_6$) solution in acetonitrile at a scan rate of 100 mV/s at room temperature under normal atmospheric conditions.

Figure 2:
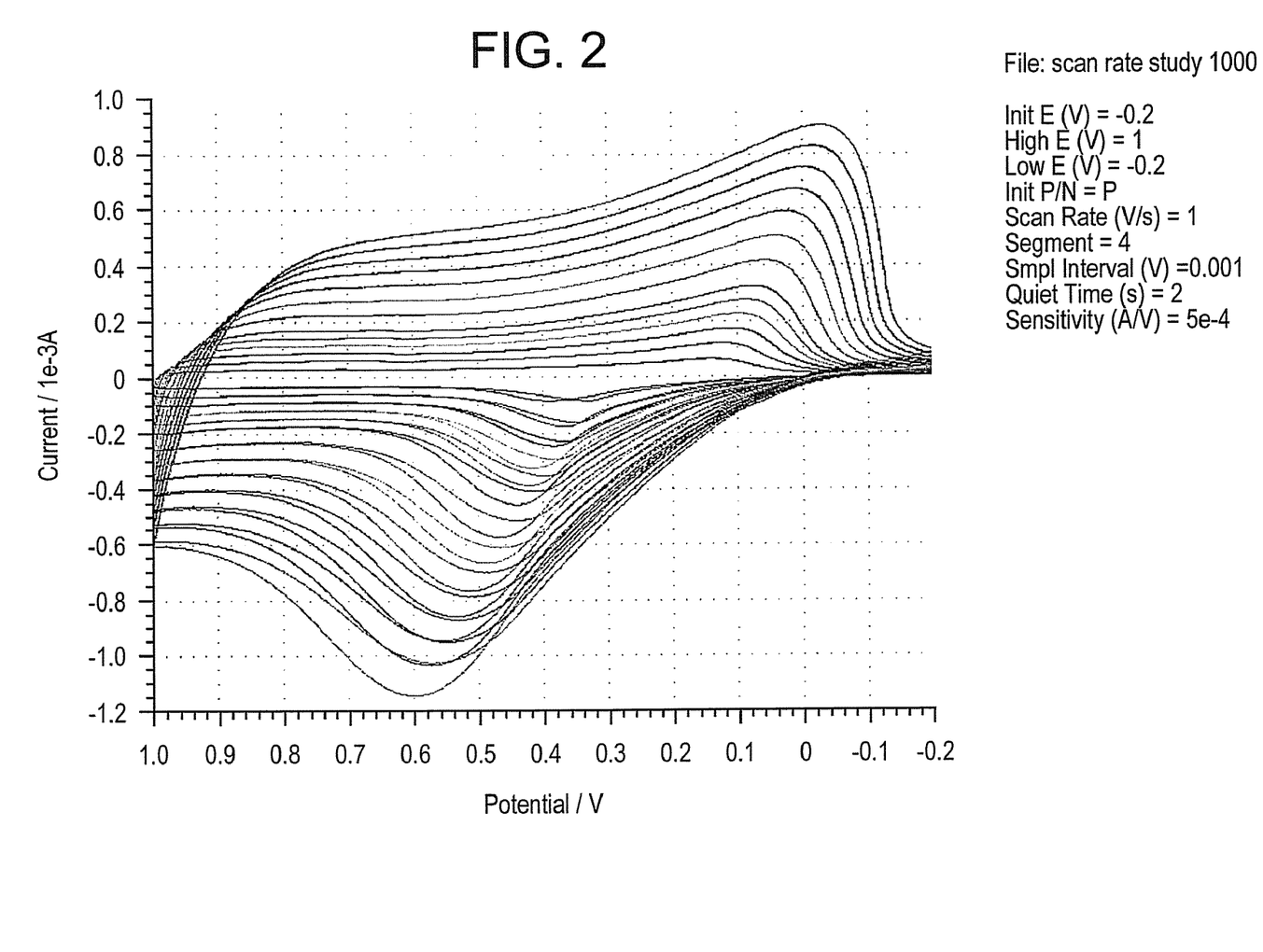
FIG. 2 illustrates the scan rate study of aDM-ProDOT polymer film.

Films were prepared having a thickness of about 500 nanometers (nm). The switching speed was about 160 milliseconds. Films are stable in the reduced state in open air for over twenty-four hours with full retention of the colored state. Films have been observed to be stable in the oxidized state in solute on for several minutes. FIG. 2 illustrates the scan rate study of a aDM-ProDOT polymer film (15 polymerization scans yielded the film) at 50 mV/s-300 mV/s in 50 mV increments and 400-1000 mV/s in 100 mV increments in 0.1 M TBAPF$_6$/acetonitrile solution. The results indicate that the film is adhered to the electrode surface and that the redox activity for aDM-ProDOT lies between 0V and 0.5 V. For thinner films, it is anticipated that there will be faster diffusion and less peak to peak separation upon increasing the scan rate (the polymer response will be faster).

Figure 3:
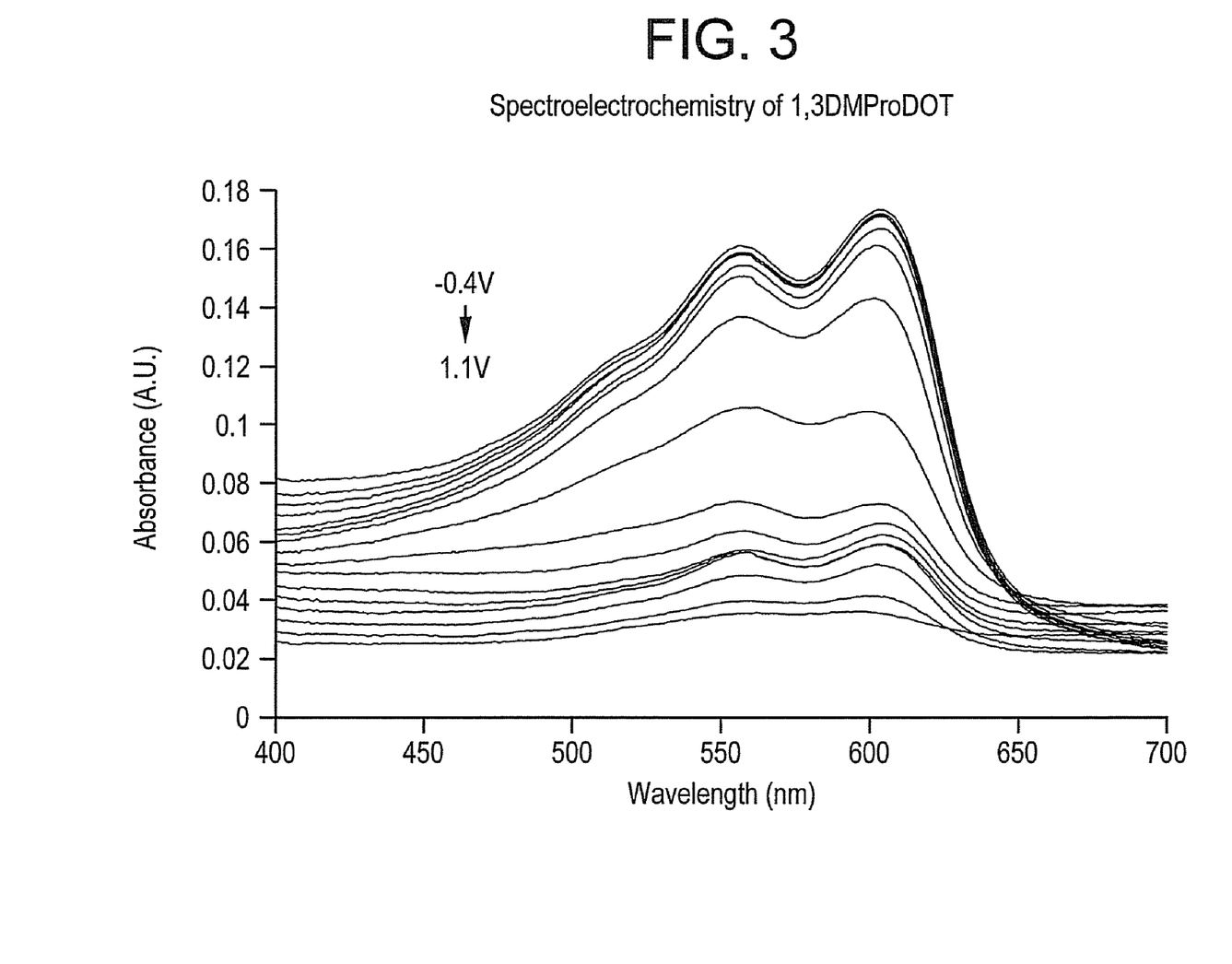
FIG. 3 illustrates the spectroelectrochemistry of aDM-ProDOT in 0.1 V potential steps in acetonitrile and 0.1 M TBAPF$_6$ on ITO glass.

FIG. 3 illustrates the spectroelectrochemistry of aDM-ProDOT in 0.1 V potential steps in acetonitrile and 0.1 M TBAPF$_6$ on indium doped tin oxide (ITO) glass. The results indicate that in the neutral state that aDM-ProDOT has an onset for the pi to pi* transition at ca. 650 nm (2 eV). Upon oxidation of the conjugated Poly(ProDOT), there is a decrease in the intensity of the pi to pi* transition with an increase in absorbance at the longer wavelength end of the visible spectrum. Upon further oxidation, the absorbance at longer wavelength goes from increasing to decreasing upon further oxidation. This is beneficial for a chromic polymer in that it will lead to a polymer with less visibly noticeable color.

A preliminary investigation of the color coordinates for poly-aDM-ProDOT is provided in Table 1 below.

TABLE 1

| Voltage | u' | v' |
|---|---|---|
| 1.1 | 0.2029 | 0.4701 |
| 1.0 | 0.2031 | 0.4700 |
| 0.9 | 0.2030 | 0.4694 |
| 0.8 | 0.2029 | 0.4692 |
| 0.7 | 0.2030 | 0.4695 |
| 0.6 | 0.2028 | 0.4699 |
| 0.5 | 0.2033 | 0.4699 |
| 0.4 | 0.2039 | 0.4694 |
| 0.3 | 0.2045 | 0.4660 |
| 0.2 | 0.2042 | 0.4626 |
| 0.1 | 0.2039 | 0.4611 |
| 0.0 | 0.2037 | 0.4608 |
| −0.1 | 0.2038 | 0.4607 |
| −0.2 | 0.2038 | 0.4611 |
| −0.3 | 0.2039 | 0.4614 |
| −0.4 | 0.2039 | 0.4616 |

Example 2

Preparation of Additional Substituted 3,4-Propylenedioxythiophene (Substituted ProDOT)

Other substituted ProDOT monomers (Table 2) can be prepared using the procedure outlined in Example 1.

Table 2

| Name | Abbreviation | Structure |
|---|---|---|
| 2,2,4,4-tetramethyl-3,4-dihydro-2H-thieno[3,4-b][1,4]dioxepine | aTM-ProDOT | |
| 2,4-dibenzyl-3,4-dihydro-2H-thieno[3,4-b][1,4]dioxepine | aDB-ProDOT | |
| 2,2,4,4-tetrabenzyl-3,4-dihydro-2H-thieno[3,4-b][1,4]dioxepine | aTB-ProDOT | |

The monomers of Table 2 are studied electrochemically using cyclic voltammetry to determine monomer oxidation potential, ease of polymerization, and polymer redox potentials. The resulting polymers are electrochemically deposited onto indium doped tin oxide coated glass from a monomer containing electrolyte solution. The electrochromic properties of the polymers are assessed using chronocoulometry in conjunction with spectrophotometry. The polymers are tested for switching speed, color using the 1976 CIE color coordinates, and memory effects. Switching speeds are determined by taking the polymer from the bleached state to the colored state at a thickness of the electrochromic polymer of 500 nm (optimal film thicknesses will be between 200 and 700 nm). Memory effects are tested by switching the polymer to the bleached state, and then removing power. While the power is off, the intensity a $\lambda_{max}$ will be monitored as a function of time until there is 10% gain (10% of the optical contrast) in absorbance. The stability of the colored state will be evaluated by switching the polymer to the colored state, removing power, and monitoring $\lambda_{max}$ as a function of time until there is 10% loss (10% of the optical contrast) in absorbance.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising", "having", "including", and "containing" are to be construed as open-ended terms (i.e., meaning "including, but not limited to") unless otherwise noted. "Or" means and/or. Recitation of ranges of values herein are merely intended to serve as a shorthand method of referring individually to each separate value falling within the range, unless otherwise indicated herein, and each separate value is incorporated into the specification as if it were individually recited herein. All ranges disclosed herein are inclusive and combinable.

The essential characteristics of the present invention are described completely in the foregoing disclosure. One skilled in the art can understand the invention and make various modifications without departing from the basic spirit of the invention, and without deviating from the scope and equivalents of the claims, which follow. Moreover, any combination of the above-described elements in all possible variations thereof is encompassed by the invention unless otherwise indicated herein or otherwise clearly contradicted by context.

What is claimed is:

1. A polymer, comprising:
a unit derived from a substituted 3,4-propylenedioxythiophene monomer according to the structure (I):

(I)

wherein each instance of $R^1$, $R^2$, $R^3$, and $R^4$ independently is hydrogen; optionally substituted $C_3$-$C_{20}$ alkyl, $C_1$-$C_{20}$ haloalkyl, aryl, $C_1$-$C_{20}$ alkoxy, $C_1$-$C_{20}$ haloalkoxy, aryloxy, —$C_1$-$C_{10}$ alkyl-O—$C_1$-$C_{10}$ alkyl, —$C_1$-$C_{10}$ alkyl-O-aryl, —$C_1$-$C_{10}$ alkyl-aryl; or hydroxyl;

with the proviso that at least one of a $R^1$ or a $R^2$ group is not hydrogen, and when $R^1$ or $R^2$ is an alkyl, at least two of the $R^1$ and $R^2$ groups are not hydrogen;

wherein the $C_3$-$C_{20}$ alkyl, $C_1$-$C_{20}$ haloalkyl, aryl, $C_1$-$C_{20}$ alkoxy, $C_1$-$C_{20}$ haloalkoxy, aryloxy, —$C_1$-$C_{10}$ alkyl-O—$C_1$-$C_{10}$ alkyl, —$C_1$-$C_{10}$ alkyl-O-aryl, or —$C_1$-$C_{10}$ alkyl-aryl group each may be optionally substituted with one or more of $C_1$-$C_{20}$ alkyl; aryl; halogen; hydroxyl; —N—$(R^7)_2$ wherein each $R^7$ is independently hydrogen or $C_1$-$C_6$ alkyl; cyano; nitro; —COOH; —S(=O)$C_0$-$C_{10}$ alkyl; or —S(=O)$_2$$C_0$-$C_{10}$ alkyl.

2. The polymer of claim 1, wherein each instance of $R^1$ and $R^2$ independently is hydrogen; optionally substituted $C_3$-$C_{10}$ alkyl, $C_1$-$C_{10}$ haloalkyl, aryl, $C_1$-$C_{10}$ alkoxy, $C_1$-$C_{10}$ haloalkoxy, aryloxy, —$C_1$-$C_5$ alkyl-O—$C_1$-$C_5$ alkyl, —$C_1$-$C_5$ alkyl-O-aryl, —$C_1$-$C_5$ alkyl-aryl; or hydroxyl; and $R^3$ and $R^4$ are both hydrogen.

3. The polymer of claim 1, wherein each instance of $R^1$ and $R^2$ independently is hydrogen; optionally substituted $C_3$-$C_5$ alkyl, $C_1$-$C_5$ haloalkyl, aryl, $C_1$-$C_5$ alkoxy, $C_1$-$C_5$ haloalkoxy, aryloxy, —$C_1$-$C_3$ alkyl-O—$C_1$-$C_3$ alkyl, —$C_1$-$C_3$ alkyl-O-aryl, —$C_1$-$C_3$ alkyl-aryl; or hydroxyl; and $R^3$ and $R^4$ are both hydrogen.

4. The polymer of claim 1, wherein each instance of $R^1$ and $R^2$ independently is hydrogen; or optionally substituted $C_3$-$C_{20}$ alkyl, $C_1$-$C_{20}$ haloalkyl, aryl, —$C_1$-$C_{10}$ alkyl-aryl; and $R^3$ and $R^4$ are both hydrogen.

5. The polymer of claim 1, wherein each instance of $R^1$ and $R^2$ independently is hydrogen; or optionally substituted $C_3$-$C_{20}$ alkyl, $C_1$-$C_{20}$ haloalkyl, aryl, —$C_1$-$C_{10}$ alkyl-aryl; and $R^3$ and $R^4$ are both hydrogen, with the proviso that at least two of the $R^1$ or $R^2$ groups are not hydrogen.

6. The polymer of claim 1, wherein at least two of the $R^1$ and $R^2$ groups are not hydrogen while the remaining two are hydrogen.

7. The polymer of claim 1, wherein the polymer is a copolymer comprising a unit derived from substituted 3,4-propylenedioxythiophene monomer and a unit derived from a co-monomer reactive with the substituted 3,4-propylenedioxythiophene monomer.

8. The polymer of claim 7, wherein the co-monomer is a substituted thieno[3,4-b]furan, thiophene, substituted thiophene, thieno[3,4-b]thiophene, substituted thienothiophene, dithieno[3,4-b:3',4'-d]thiophene, thieno[3,4-b]furan, substituted thieno[3,4-b]furan, bithiophene, pyrrole, substituted pyrrole, phenylene, substituted phenylene, naphthalene, substituted naphthalene, biphenyl, substituted biphenyl, terphenyl, substituted terphenyl, phenylene vinylene, substituted phenylene vinylene, or a combination comprising at least one of the foregoing co-monomers, wherein the substituent is a hydroxyl, $C_6$-$C_{12}$ aryl, $C_3$-$C_{10}$ cycloalkyl, $C_1$-$C_{12}$ alkyl, halogen, $C_1$-$C_{12}$ alkoxy, $C_1$-$C_{12}$ alkylthio, $C_1$-$C_{12}$ haloalkyl, $C_6$-$C_{12}$ haloaryl, pyridyl, cyano, thiocyanato, nitro, amino, $C_1$-$C_{12}$ alkylamino, $C_1$-$C_{12}$ aminoalkyl, acyl, sulfoxyl, sulfonyl, sulfonate, phosphonate, amido, carbamoyl, or a combination comprising at least one of the foregoing substituents.

9. The polymer of claim 7, wherein the co-monomer has the structure of any one of (III) to (XXIX), (III)

(IV)

(V)

(VI)

-continued (VII)

(VIII)

(IX)

(X)

(XI)

(XII)

(XIII)

(XIV)

-continued (XXVI)

(XXVII)

(XXVIII)

, or (XXIX)

wherein each occurrence of $Q^1$ is independently S or O;

each occurrence of $Q^2$ is independently S, O, or N—$R^7$;

each occurrence of $Q^3$ is independently $CH_2$, S, or O;

each occurrence of $Q^4$ is independently $C(R^6)_2$, S, O, or N—$R^7$;

each occurrence of $R^6$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl;

each occurrence $R^7$ is independently hydrogen or $C_1$-$C_6$ alkyl;

each occurrence $R^8$ is independently an electron withdrawing group;

each occurrence $R^9$ is independently hydrogen, $C_1$-$C_6$ alkyl, or cyano;

each occurrence E is independently O or $C(R^8)_2$; and each occurrence of is independently an aryl.

10. An article comprising the polymer of claim 1.

11. A method, comprising:
polymerizing a composition by electrochemical or chemical reaction to form a polymer, wherein the composition comprises substituted 3,4-propylenedioxythiophene monomer according to the structure (I):

(I)

wherein each instance of $R^1$, $R^2$, $R^3$, and $R^4$ independently is hydrogen; optionally substituted $C_3$-$C_{20}$ alkyl, $C_1$-$C_{20}$ haloalkyl, aryl, $C_1$-$C_{20}$ alkoxy, $C_1$-$C_{20}$ haloalkoxy, aryloxy, —$C_1$-$C_{10}$ alkyl-O—$C_1$-$C_{10}$ alkyl, —$C_1$-$C_{10}$ alkyl-O-aryl, —$C_1$-$C_{10}$ alkyl-aryl; or hydroxyl;

with the proviso that at least one of a $R^1$ or a $R^2$ group is not hydrogen, and when $R^1$ or $R^2$ is an alkyl, at least two of the $R^1$ and $R^2$ groups are not hydrogen;

wherein the $C_3$-$C_{20}$ alkyl, $C_1$-$C_{20}$ haloalkyl, aryl, $C_1$-$C_{20}$ alkoxy, $C_1$-$C_{20}$ haloalkoxy, aryloxy, —$C_1$-$C_{10}$ alkyl-O—$C_1$-$C_{10}$ alkyl, —$C_1$-$C_{10}$ alkyl-O-aryl, or —$C_1$-$C_{10}$ alkyl-aryl group each may be optionally substituted with one or more of $C_1$-$C_{20}$ alkyl; aryl; halogen; hydroxyl; —N—$(R^7)_2$ wherein each $R^7$ is independently hydrogen or $C_1$-$C_6$ alkyl; cyano; nitro; —COOH; —S(=O)$C_0$-$C_{10}$ alkyl; or —S(=O)$_2C_0$-$C_{10}$ alkyl.

12. The method of claim 11, wherein each instance of $R^1$ and $R^2$ independently is hydrogen; optionally substituted $C_3$-$C_{10}$ alkyl, $C_1$-$C_{10}$ haloalkyl, aryl, $C_1$-$C_{10}$ alkoxy, $C_1$-$C_{10}$ haloalkoxy, aryloxy, —$C_1$-$C_5$ alkyl-O—$C_1$-$C_5$ alkyl, —$C_1$-$C_5$ alkyl-O-aryl, —$C_1$-$C_5$ alkyl-aryl; or hydroxyl; and $R^3$ and $R^4$ are both hydrogen.

13. The method of claim 11, wherein each instance of $R^1$ and $R^2$ independently is hydrogen; optionally substituted $C_3$-$C_5$alkyl, $C_1$-$C_5$ haloalkyl, aryl, $C_1$-$C_5$ alkoxy, $C_1$-$C_5$ haloalkoxy, aryloxy, —$C_1$-$C_3$ alkyl-O—$C_1$-$C_3$ alkyl, —$C_1$-$C_3$ alkyl-O-aryl, —$C_1$-$C_5$ alkyl-aryl; or hydroxyl; and $R^3$ and $R^4$ are both hydrogen.

14. The method of claim 11, wherein the composition further comprises a co-monomer reactive with the substituted 3,4-propylenedioxythiophene monomer.

15. The method of claim 14, wherein the co-monomer is a substituted thieno[3,4-b]furan, thiophene, substituted thiophene, thieno[3,4-b]thiophene, substituted thienothiophene, dithieno[3,4-b:3',4'-d]thiophene, thieno[3,4-b]furan, substituted thieno[3,4-b]furan, bithiophene, pyrrole, substituted pyrrole, phenylene, substituted phenylene, naphthalene, substituted naphthalene, biphenyl, substituted biphenyl, terphenyl, substituted terphenyl, phenylene vinylene, substituted phenylene vinylene, or a combination comprising at least one of the foregoing co-monomers, wherein the substituent is a hydroxyl, $C_6$-$C_{12}$ aryl, $C_3$-$C_{10}$ cycloalkyl, $C_1$-$C_{12}$ alkyl, halogen, $C_1$-$C_{12}$ alkoxy, $C_1$-$C_{12}$ alkylthio, $C_1$-$C_{12}$ haloalkyl, $C_6$-$C_{12}$ haloaryl, pyridyl, cyano, thiocyanato, nitro, amino, $C_1$-$C_{12}$ alkylamino, $C_1$-$C_{12}$ aminoalkyl, acyl, sulfoxyl, sulfonyl, sulfonate, phosphonate, amido, carbamoyl, or a combination comprising at least one of the foregoing substituents.

16. The process of claim 11, wherein electrochemical reaction is in an electrochemical cell comprising an electrolyte, a working electrode, a counter electrode, and a reference electrode in operable communication.

17. The process of claim 16, wherein the working electrode is a platinum, gold, or vitreous carbon working electrode, stainless steel and the counter electrode is platinum, stainless steel or gold.

18. The process of claim 16, wherein the working electrode is a vitreous carbon electrode and the electrolyte is tetrabutylammonium perchlorate/acetonitrile.

19. The process of claim 11, wherein the electrochemical reaction provides the polymer on an indium tin oxide substrate.

20. The process of claim 11, further comprising reducing the polymer.

* * * * *